Aug. 18, 1959 R. S. ENABNIT 2,900,454

D.C. AMPLIFIER

Filed July 26, 1954

*INVENTOR.*
ROBERT S. ENABNIT

*BY*

R. L. Miller
ATTORNEY 2,900,454
Patented Aug. 18, 1959

2,900,454

D.C. AMPLIFIER

Robert S. Enabnit, Cuyahoga Falls, Ohio, assignor to The Goodyear Tire & Rubber Company, Akron, Ohio, a corporation of Ohio Application July 26, 1954, Serial No. 445,761

4 Claims. (Cl. 179—171)

This invention relates to an electronic direct-current amplifier, and more particularly to an amplifier substantially unaffected by power supply variations and possessing high sensitivity.

Many direct-coupled amplifiers suffer from output instability due to the necessity of providing grid bias voltage for successive stages from an unregulated power supply; especially in the low-level stages where any power supply variations are subject to full amplification within subsequent circuits.

One method of compensation for high gain amplifiers is to provide for close power supply regulation. However, since the level of voltage required to provide the plate voltage of each tube is relatively high, accurate voltage regulation becomes more difficult to achieve.

The general object of this invention is to provide an amplifier that is substantially unaffected by power supply variations, thus eliminating an elaborate and costly regulated power supply.

Another object of this invention is to provide an amplifier of high sensitivity, excellent gain characteristics, and stability.

Still another object of this invention is to provide an amplifier having a low output impedance.

A further object of this invention is to provide an amplifier that is relatively simple in design, economical in cost, and efficient in operation.

The aforesaid objects of the invention, and other objects which will become apparent as the description proceeds, are achieved by the provision of an amplifier consisting of four stages each embodying an electron discharge device such as a thermionic vacuum tube and preferably by the use of two duo-triode tubes.

Power supply fluctuations are compensated for in the input stage by providing anode potential from the power supply only to the second stage discharge device, and supplying the anode of the first stage discharge device with an energizing potential from the cathode of the second stage discharge device and operating the first stage discharge device near the cut-off region of the transfer characteristics curves. In the second and third stage discharge devices, any power supply fluctuations are substantially counteracted by an inversely proportionally changing grid bias potential. The fourth stage is relatively unaffected by power supply fluctuations as the through signal present at the input to the fourth stage is of a high level strength due to previous amplification. High sensitivity is achieved through the use of multiple feed-back means.

For a better understanding of the invention, reference is had to the accompanying drawings, wherein.

Figure 1:
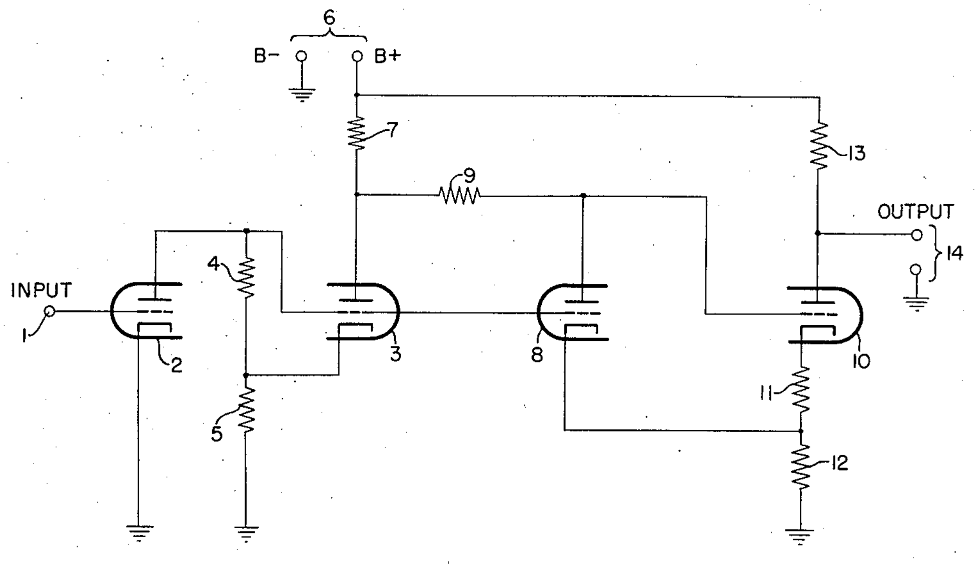
Fig. 1 is a schematic of the amplifier.

In Fig. 1, the input 1 of the amplifier is connected to the control electrode or grid of a triode 2; the triode 2 and its associated circuits constituting the first input stage. The cathode of the triode 2 is grounded and the anode or plate is connected to the grid of a triode 3 and also to ground through a plate-load resistor 4 and a cathode resistor 5, the latter both series-connected. The triode 3 and its associated circuits constitute the second stage of the amplifier. The triodes 2 and 3 are sections of a duo-triode tube such as a 12AT7 type. The cathode of the triode 3 is connected to the common junction of the resistors 4 and 5. The plate of the triode 3 is connected to a B+ voltage source 6 through a plate-load resistor 7.

The plate of the triode 3 is also connected to the plate of a triode 8 through a resistor 9; the plate of the triode 8 being in turn connected to the grid of a triode 10; the triodes 8 and 10 and their associated circuits constituting the third and fourth stages of the amplifier. The triodes 8 and 10 are sections of a duo-triode tube such as a 12AU7 type. The grid of the triode 8 is connected to the grid of the triode 3 and the cathode of the triode 8 is connected through a cathode resistor 11 to the cathode of the triode 10, and through another cathode resistor 12 to ground. The plate of the triode 10 is connected to the B+ voltage source 6 through a plate-load resistor 13 and to the amplifier output 14.

In operation, an electron current flows through the second stage from the ground side of the resistor 5, through the resistor 5, from the cathode to the plate of the triode 3, through the resistor 7, to the B+ terminal 6. The common junction of the resistors 4 and 5 is thus positive with respect to ground. This second stage circuit acts as a voltage-divider network to supply the anode potential for the triode 2 through the resistor 4. The resulting potential imposed on the anode of the triode 2 is positive with respect to the cathode of the triode 2 and an electron current flows from the grounded cathode to the plate of the triode 2 and then through the resistor 4. A change in the grid input signal to the triode 2 from the input terminal 1 is reflected in a change in the current flow through the triode 2. This change in the current flow through the first stage results in a change in voltage drop across the resistor 4 and a proportional change in the potential of the anode of the triode 2. As the anode of the triode 2 is directly connected to the grid of the triode 3, the result is a change in the current flow through the triode 3. But any change in the current flow through the triode 3 is reflected in a change in the potential at the common junction of the resistors 4 and 5. Thus a feed-back action occurs in the amplifying functioning of the triodes 2 and 3. This feed-back action is necessary to effect amplification in the first stage, as the triode 2 is operated near the region of grid cut-off bias for reasons hereinafter described.

The resistors 9, 11, and 12 are so proportioned that a negative grid bias is present in the triode 10, resulting in a flow of electron current through the resistors 12 and 11 from ground, through the triode 10, through the resistor 13 to the B+ voltage source 6. The common junction of the resistors 11 and 12 is consequently at a positive potential with respect to ground.

As the grid potential and the grid bias of the triode 10 vary due to the effect of changes in the current flow through the resistor 7 caused by the change in the input signal to the input stage as previously described, the electron current flow through the triode 10 also varies, and the cathode potential of the triode 8 likewise varies, thus affecting the electron current flow through the triode 8; the interconnection between the two cathodes of the triodes 8 and 10 acting as a regenerative feed-back circuit adding to the further amplification of the through signal.

The variations in the current flow through the fourth stage are reflected in changes in potential at the anode of the triode 10 and thus appear in amplified form at the output terminal 14 as representations of the input signal variations at the terminal 1.

Fluctuations such as an increase in the power supply potential level are directly evident in an increased plate potential in the triodes 3, 8, and 10. In the triode 3 an increase in current flow therein occurs as a result, and, as the plate voltage for the triode 2 is derived from the common junction of the resistors 4 and 5, the plate voltage of the triode 2 also increases. However, the triode 2 is designed through the proportioning of the resistors 4, 5, and 7, and the grid biasing of the triode 2, to operate near the cut-off region of the transfer characteristic curves for the triode 2. Thus a substantial increase in B+ voltage at the terminal 6 results in only a slight increase in the current flow through the triode 2 as it is relatively insensitive to plate voltage fluctuations.

In the triode 3, the grid is coupled to the cathode of the triode 3 and thus is sensitive to changes in potential at the common junction of the resistors 4 and 5. When the power supply potential level increases, the anode potential of the triode 3 tends to increase with a consequent increase in the current flow therein, and an increase in the potential level at the common junction of the resistors 4 and 5 occurs. Thus the grid of the triode 3 is more positive with respect to the cathode and thus acts to further increase the current flow through the triode 3. However, the voltage drop across the resistor 7 also increases, thus lowering the anode potential of the triode 3. The net result is that although the increase in the power supply potential level tends to increase the anode potential and the current flow in the triode 3, the grid action in the triode 3 is such as to decrease both and thus substantially counteract the effect of the increased B+ voltage at the terminal 6.

The grid of the triode 8 is directly connected to the grid of the triode 3, and thus is sensitive to changes in potential at the common junction of the resistors 4 and 5. An increase in B+ potential level at the terminal 6 is reflected, as hereinbefore described, in the common junction of the resistors 4 and 5 becoming more positive with reference to ground. Thus the increase in B+ potential level results in the grid of the triode 8 being more positive with reference to the cathode of the triode 8. The net result is that although the increased B+ potential level increases the plate potential of the triode 8, the grid bias also changes as a result of the grid-to-grid coupling of the second and third stages so as to increase the current flow through the triode 8, thus increasing the voltage drop across the resistor 9 and substantially counteracting the effect of the increased B+ potential level.

Through the interaction of the stages described above, the through signal is relatively unaffected by power supply fluctuations as it passes through the first three amplification stages wherein it is at a fairly low level strength. The fourth output stage, although affected by fluctuations in B+ potential level, is passing a signal of relatively high level strength and the effect on the signal is not serious in nature.

Figure 2:
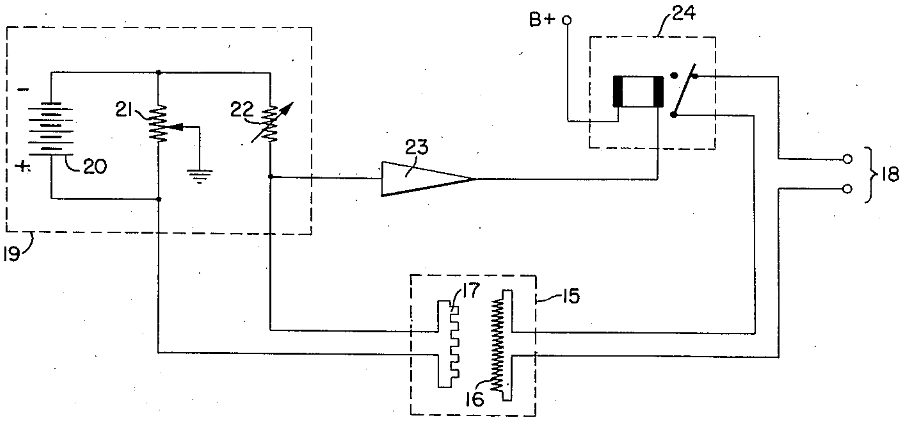
Fig. 2 is a schematic of a temperature control circuit utilizing the amplifier.

In Fig. 2, a typical application of the invention is shown as applied to a temperature control device. Embodied within the chamber 15, wherein it is desired to control the temperature, are two elements: a heating element 16 and a temperature-sensitive resistance element 17. For purposes of simplicity in illustrating the operation of the invention, the heating element 16 is taken to be an ordinary electrical resistance heating element powered by an external electrical energy source at the terminals 18.

The temperature-sensitive element 17 is one part of a Wheatstone bridge circuit 19. Voltage is applied to the bridge from a battery 20 across a variable resistance 21 which is in parallel with the combination of another variable resistance 22 series-connected with the temperature-sensitive element 17. The movable element of the variable resistance 21 is grounded and the common junction of the variable resistor 22 and the temperature-sensitive element 17 is connected to the input of the amplifier 23 which is shown schematically in Fig. 1.

A normally-closed-switch plate-circuit relay 24 is connected to the amplifier 23 in such manner that the relay actuating coil functions as a plate-load resistance on the triode 10 replacing the plate-load resistor 13 in Fig. 1.

The resistors 21 and 22 are initially set so as to balance the bridge 19 at the desired temperature level. When the bridge circuit 19 is in proper adjustment the potentials existent on the cathode and grid of the triode 22 are such that the bias of the grid with reference to the cathode of the triode 2 is about −1.2 volts. Circuit parameters can be ajusted so that the input grid bias voltage is less than −1.2 volts if desired, but higher gain is achieved the nearer the triode 2 is operated to its cut-off bias.

In operation, when the temperature within the chamber 15 is at the desired level, as determined by the settings of the variable resistors 21 and 22, a grid bias voltage of −1.2 volts will be present in the triode 2 and the resultant plate current flowing through the relay coil 24 from the plate of the triode 10 will be sufficient to actuate the relay 24 and thus de-energize the electrical heating element 16. When the temperature falls within the chamber 15, the bridge 19 is unbalanced as the resistance of the temperature-sensitive element 17 is changed. Assuming a negative coefficient of resistivity for the material constituting the temperature-sensitive element 17, as the temperature of the chamber 15 decreases, the resistance of the element 17 will increase. The grid bias of the triode 2 will become increasingly more negative. The end result is a decreased plate current through the triode 10 and the consequent opening of the relay 24, thus energizing the heating element 16 and restoring the temperature level within the chamber 15. The high sensitivity of the amplifier 23 attained by means of multiple feed-back connections and the insensitivity to power supply variations were instrumental in achieving with ease a 0.1° C. control range within the chamber 15.

While certain representative embodiments and details have been shown for the purpose of illustrating the invention, it will be apparent to those skilled in this art that various changes and modifications may be made therein without departing from the spirit or scope of the invention.

I claim:

1. An amplifier comprising at least a first input stage, a second and a third amplifying stage, and a fourth output stage, each stage including an electron discharge device having at least a cathode, a control electrode, and an anode, voltage means coupled to the anodes and cathodes of and for energizing the second, third, and fourth stage discharge devices, means for directly connecting the cathode of the first stage discharge device to the return circuit of said voltage means, means adapted to receive an input and connected to the control electrode of the first stage discharge device, conductive means connecting the anode of the first stage discharge device to the control electrodes of the second and third stage discharge devices, conductive means coupling the anode of the first stage discharge device to the cathode of the second stage discharge device, conductive means coupling the control electrode of the fourth stage discharge device to both the anodes of the second and third stage discharge devices, conductive means coupling the cathodes of the third and fourth stage discharge devices, and output means coupled to the anode of the fourth stage discharge device.

2. An amplifier comprising at least a first input stage, a second and a third amplifying stage, and a fourth output stage, each stage including an electron discharge device having at least a cathode, a control electrode, and an anode, voltage means coupled to the anodes and cathodes of and for energizing the second, third, and fourth stage discharge devices, means for directly connecting the cathode of the first stage discharge device to the return circuit of said voltage means, means adapted to receive an input and connected to the control electrode of the first stage discharge device, conductive means connecting the anode of the first stage discharge device to the control electrodes of the second and third stage discharge devices, conductive means coupling the anode of the first stage discharge device to the cathode of the second stage discharge device, a first load resistor interconnected between the anode of the second stage discharge device and both the anode of the third stage discharge device and the control electrode of the fourth stage discharge device, a first cathode resistor interconnected between the cathodes of the third and fourth stage discharge devices, and output means connected to the anode of the fourth stage discharge device.

3. An amplifier comprising at least a first input stage, a second and a third amplifying stage, and a fourth output stage, each stage including an electron discharge device having at least a cathode, a control electrode, and an anode, a source of direct-current potential, a load resistor interconnected between the positive side of the source of direct-current potential and the anode of the second stage discharge device, a cathode resistor interconnected between the negative side of the source of direct-current potential and the cathode of the second stage discharge device, conductive means connecting the anode of the first stage discharge device to the control electrodes of the second and third stage discharge devices, a resistor interconnected between the anode of the first stage discharge device and the cathode of the second stage discharge device, means adapted to receive an input and coupled to the control electrode of the first stage discharge device, conductive means connecting the cathode of the first stage discharge device and the negative side of the source of direct-current potential, conductive means coupling the control electrode of the fourth stage discharge device to the anodes of the second and third stage discharge devices, conductive means coupling the cathodes of the third and fourth stage discharge devices and to the negative side of the source of the direct-current potential, means coupling the anode of the fourth stage discharge device to the positive side of said source of direct-current potential, and output means coupled to the anode of the fourth stage discharge device.

4. An amplifier comprising at least a first input stage, a second and a third amplifying stage, and a fourth output stage, each stage including an electron discharge device having at least a cathode, a control electrode, and an anode, a source of direct-current potential, means adapted to receive an input and connected to the control electrode of the first stage discharge device, a first and a second resistor interconnected between the positive side of the source of direct-current potential and the anodes of the second and fourth stage discharge devices respectively, a first and a second cathode resistor interconnected between the negative side of the source of direct-current potential and the cathodes of the second and fourth stage discharge devices respectively, conductive means connecting the anode of the first stage discharge device to the control electrodes of the second and third stage discharge devices, a first resistor interconnected between the anode of the first stage discharge device and the cathode of the second stage discharge device, a second resistor interconnected between the anode of the second stage discharge device and both the anode and control electrode of the third and fourth stage discharge devices respectively, a third resistor interconnected between the cathodes of the third and fourth stage discharge devices, conductive means connecting the cathode of the first stage discharge device to the negative side of the direct-current potential source, and output means connected to the anode of the fourth stage discharge device.

References Cited in the file of this patent

UNITED STATES PATENTS

| | | |
|---|---|---|
| 1,989,829 | Specht | Feb. 5, 1935 |
| 2,275,317 | Ryder | Mar. 3, 1942 |
| 2,420,731 | Artzt | May 20, 1947 |
| 2,424,893 | Mansford | July 29, 1947 |
| 2,516,201 | Goodwin | July 25, 1950 |
| 2,538,488 | Volkers | Jan. 16, 1951 |
| 2,563,245 | Jofeh | Aug. 7, 1951 |
| 2,600,453 | Weingart | June 17, 1952 |
| 2,631,198 | Parisoe | Mar. 10, 1953 |
| 2,670,410 | Williams | Feb. 23, 1954 |
| 2,743,325 | Kaiser et al. | Apr. 24, 1956 |
| 2,787,672 | Crosby | Apr. 2, 1957 |

OTHER REFERENCES

Article by Artzt, "Survey of D.C. Amplifiers," RCA reprint from August 1945 issue of Electronics, 7 pages. (Copy in 179–171–1D.)